(12) United States Patent
Morgan

(10) Patent No.: US 10,374,577 B2
(45) Date of Patent: Aug. 6, 2019

(54) OPTIMAL RESPONSE REFLECTIONLESS FILTERS

(71) Applicant: Associated Universities, Inc., Washington, DC (US)

(72) Inventor: Matthew Alexander Morgan, Earlysville, VA (US)

(73) Assignee: Associated Universities, Inc., Washington, DC (US)

( * ) Notice: Subject to any disclaimer, the term of this patent is extended or adjusted under 35 U.S.C. 154(b) by 122 days.

(21) Appl. No.: 15/811,850

(22) Filed: Nov. 14, 2017

(65) Prior Publication Data

US 2018/0083601 A1   Mar. 22, 2018

Related U.S. Application Data

(63) Continuation-in-part of application No. 15/298,459, filed on Oct. 20, 2016, now Pat. No. 10,263,592.

(60) Provisional application No. 62/248,768, filed on Oct. 30, 2015, provisional application No. 62/290,270, filed on Feb. 2, 2016, provisional application No. 62/372,974, filed on Aug. 10, 2016.

(51) Int. Cl.
  *H03H 11/10*   (2006.01)
  *H03H 7/38*   (2006.01)
  *H03H 7/06*   (2006.01)

(52) U.S. Cl.
  CPC .............. *H03H 11/10* (2013.01); *H03H 7/06* (2013.01); *H03H 7/38* (2013.01)

(58) Field of Classification Search
  CPC .......... H03H 7/38; H03H 7/0115; H03H 7/06; H03H 2001/0085; H03H 11/10

USPC .......................................... 333/32, 168, 175
See application file for complete search history.

(56) References Cited

U.S. PATENT DOCUMENTS 3,514,722 A   5/1970   Cappucci et al.
3,605,044 A   9/1971   Seidel et al.
(Continued)

FOREIGN PATENT DOCUMENTS

CA   2629035   9/2009

OTHER PUBLICATIONS

PCT Search Report and Written Opinion for PCT/US16/057829 dated Feb. 23, 2017.
(Continued)

*Primary Examiner* — Rakesh B Patel
(74) *Attorney, Agent, or Firm* — Remenick PLLC

(57) ABSTRACT

Reflectionless low-pass, high-pass, band-pass, band-stop, all-pass, all-stop, and multi-band filters, as well as a method for designing such filters is disclosed, along with a method of enhancing the performance of such filters through the use of unmatched sub-networks to realize an optimal frequency response, such as the Chebyshev equal-ripple response. These filters preferably function by absorbing the stop-band portion of the spectrum rather than reflecting it back to the source, which has significant advantages in many different applications. The unmatched sub-networks preferably offer additional degrees of freedom by which element values can be assigned to realize improved cutoff sharpness, stop-band rejection, or other measures of performance. The elements of the filter may be physical passive elements, or synthesized with active circuits, potentially realizing even negative element-values for improved performance.

11 Claims, 19 Drawing Sheets

(56) References Cited

U.S. PATENT DOCUMENTS

| | | | |
|---|---|---|---|
| 3,748,601 | A | 7/1973 | Seidel |
| 3,869,585 | A | 3/1975 | Snyder |
| 4,123,732 | A | 10/1978 | Daniel |
| 4,287,391 | A | 9/1981 | Queen |
| 5,319,329 | A | 6/1994 | Shiau et al. |
| 5,345,375 | A | 9/1994 | Mohan |
| 5,982,142 | A | 11/1999 | Sullivan et al. |
| 6,122,533 | A | 9/2000 | Zhang et al. |
| 7,232,955 | B1 | 6/2007 | Shadel et al. |
| 8,392,495 | B2 * | 3/2013 | Morgan .................. H01P 1/20 708/819 |
| 2002/0024392 | A1 | 2/2002 | Maruyama et al. |
| 2007/0152750 | A1 | 7/2007 | Andersen et al. |
| 2008/0297284 | A1 | 12/2008 | Ishii et al. |
| 2010/0205233 | A1 | 8/2010 | Morgan |
| 2012/0023059 | A1 | 1/2012 | Morgan et al. |
| 2013/0154761 | A1 * | 6/2013 | Ilkov ..................... H03H 7/465 333/101 |
| 2013/0257561 | A1 | 10/2013 | Gorostegui |
| 2016/0126606 | A1 | 5/2016 | Morgan |

OTHER PUBLICATIONS

Morgan, M. et al. Reflectionless Filter Structures. Jul. 29, 2014.
Morgan, M. Enhancement of Reflectionless Filters Using Stop-Band Sub-Networks. Jul. 2014.

* cited by examiner

EVEN-MODE EQUIVALENT CIRCUIT

ODD-MODE EQUIVALENT CIRCUIT

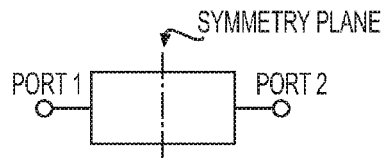
FIG. 24A
FIG. 24B
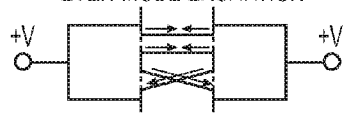
FIG. 24C
FIG. 24D
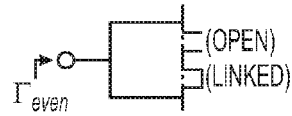
FIG. 24E
FIG. 24F
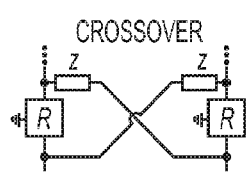
FIG. 25A
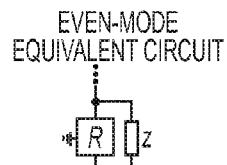
FIG. 25B
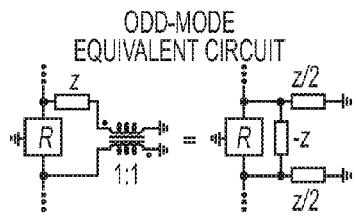
FIG. 25C
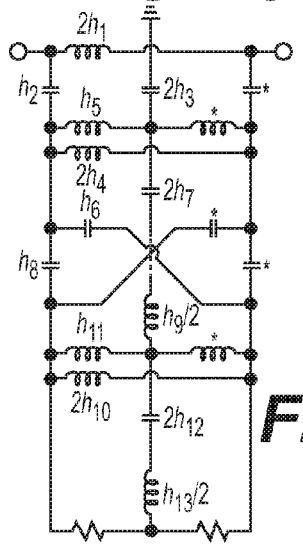
FIG. 26A
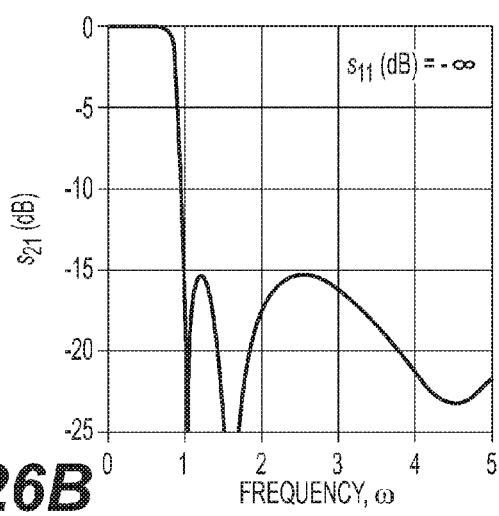
FIG. 26B

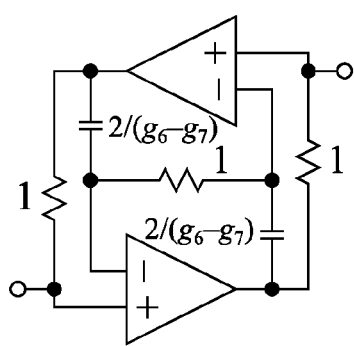
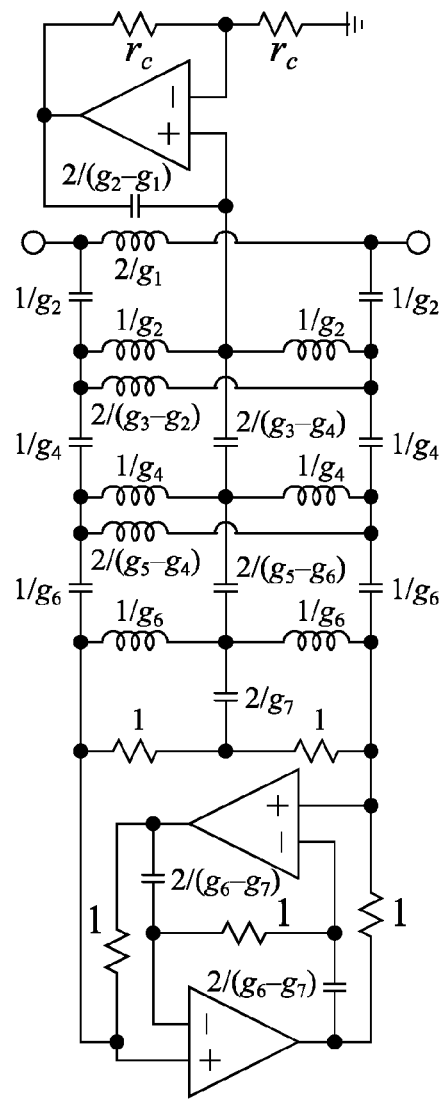
FIGURE 34C
FIGURE 34D

OPTIMAL RESPONSE REFLECTIONLESS FILTERS

REFERENCE TO RELATED APPLICATIONS

This application is a Continuation-In-Part application to U.S. Non-Provisional application Ser. No. 15/298,459, filed Oct. 20, 2016, entitled "Optimal Response Reflectionless Filters," which claims priority to U.S. Provisional Application Nos. 62/248,768, filed Oct. 30, 2015, 62/290,270, filed Feb. 2, 2016, and 62/372,974, filed Aug. 10, 2016, all entitled "Optimal Response Reflectionless Filters," and all hereby specifically and entirely incorporated by reference.

RIGHTS IN THE INVENTION

This invention was made with government support under Cooperative Agreement AST-0223851, between the National Science Foundation and Associated Universities, Inc., and, accordingly, the United States government has certain rights in this invention.

BACKGROUND

1. Field

The invention is directed toward electronic filters and methods of their use. Specifically, the invention is directed toward reflectionless electronic filters and methods of their use.

2. Background

Virtually all electronic systems use some kind of filtering to reject unwanted frequency components. In most conventional filters, the rejected signals are bounced back to the source, eventually dissipating in the generator itself, or in the interconnecting wires/transmission lines, or being radiated into the instrument housing. This manner of rejecting unwanted signals can sometimes lead to harmful interactions with other components in the system, either by spurious mixing in non-linear devices, unintentional re-biasing of sensitive active components, or cross-talk between various signal paths. A solution was sought for a filter that would absorb these unwanted signals before they could compromise performance. This led to a novel absorptive filter topology which was patented in 2013 (U.S. Pat. No. 8,392,495), and additional non-provisional applications (U.S. application Ser. Nos. 14/724,976 and 14/927,881) the entirety of which are incorporated by reference herein. FIGS. 1 and 2 depict examples of low-pass reflectionless filters of the prior art. The absorptive filter solved many problems encountered with conventional filters, such as the sensitivity of mixers to poor out-of-band terminations, detrimental and difficult-to-predict non-linear effects from reactive harmonic loading, leakage or cross-talk due to trapped energy between the filter and other poorly-matched components, and numerous other problems associated with out-of-band impedance matching. It also realized superior performance and manufacturability when compared to other approaches to absorptive filters, such as terminated diplexers and directional filter structures employing quadrature hybrids.

Despite these benefits, however, the more sophisticated versions of the reflectionless filter topologies were unable to realize classically-optimal filter pass-band responses such as the Chebyshev equal-ripple response. Recent efforts to address this issue have yielded a generalized version of the structure which can realize a broader range of responses, including the Chebyshev Type I and Type II equal-ripple responses, Zolotarev Type I and Type II responses, and even pseudo-elliptical responses, all while maintaining the benefits of the original reflectionless filter topology.

SUMMARY

The present invention addresses several of the problems and disadvantages associated with conventional filters, and with the prior art of reflectionless filters, thereby providing a new resource for band selection and definition in electronic systems.

An embodiment of the invention is directed to a reflectionless electronic filter. The filter preferably comprises a symmetric two-port circuit, wherein the symmetry defines an even-mode equivalent circuit and an odd-mode equivalent circuit when the ports are driven in-phase and 180° out-of-phase, respectively; at least one lossless element and at least one unmatched internal sub-network topology, wherein the mismatch of the internal sub-network topology or topologies interact with the surrounding circuit such that: a normalized input impedance of the even-mode equivalent circuit is substantially equal to a normalized input admittance of the odd-mode equivalent circuit and a normalized input impedance of the odd-mode equivalent circuit is substantially equal to a normalized input admittance of the even-mode equivalent circuit. In this way, the even- and odd-mode equivalent circuits are said to be duals of each other.

Preferably, the element values of the reflectionless filter are assigned such that the even- and odd-mode equivalent circuits realize a Chebyshev equal-ripple response. In one embodiment, the ripple factor of the Chebyshev response may be chosen such that the first two elements of the even- or odd-mode equivalent circuits are of equal normalized value. The ripple factor may also be chosen such that the last two elements of the even- or odd-mode equivalent circuits have equal normalized value. In another embodiment, the network may be augmented by auxiliary elements and the ripple factor is chosen such that first two or last two elements of the even- or odd-mode equivalent circuits are not equal. In a preferred embodiment, the first element of the even- or odd-mode equivalent circuit may have greater normalized value than the second element, or the last element has greater normalized value than the second-to-last element.

A first sub-network topology preferably comprises a filter that contains a second sub-network topology, and the total number of filters nested, including the top-level filter, provides the filter rank. Preferably, the even- or odd-mode equivalent circuits realize a Chebyshev response, and the order of that response is one plus two times the rank.

In one embodiment, the input and output ports are located at their original positions in the symmetric two-port network. Preferably, the transmission response is that of a Chebyshev Type II filter, having ripples in the stop-band.

In another embodiment, one of the original ports is terminated, and a second port is instead located in place of a resistive termination within the original network. Preferably, the transmission response of this embodiment is that of a Chebyshev Type I filter, having ripples in the pass-band.

In another embodiment, the element values of the reflectionless filter are assigned such that the even- and odd-mode equivalent circuits realize a Zolotarev response. In one embodiment, the input and output ports are located at their original positions in the symmetric two-port network. Preferably, the transmission response is that of a Zolotarev Type II filter, having ripples in the stop-band.

In another embodiment, one of the original ports is terminated, and a second port is instead located in place of a resistive termination within the original network. Preferably, the transmission response of this embodiment is that of a Zolotarev Type I filter, having ripples in the pass-band.

In a preferred embodiment, some of the elements are modified by delta-wye transformations, or other equivalent-impedance transformations. Preferably, these transformations yield components with more moderate values than the original, facilitating ease of practical implementation and high-frequency performance.

In some embodiments, one or more of the ports is differential. Preferably, one or more of the differential ports is converted to single-ended with a balun or transformer. In another preferred embodiment, the filter is an anti-aliasing filter and a transformer is used to couple the filter output to the differential inputs of an analog-to-digital converter.

In some embodiments, the circuit is symmetric and planar, in that it can be drawn on a flat sheet of paper without crossovers. The line of symmetry of such a circuit may pass through nodes in the circuit diagram, which equate to open- and short-circuit boundary conditions in the even- and odd-mode equivalent circuits, respectively. In other embodiments, the circuit may be electrically symmetric without being topologically symmetric. In a preferred embodiment, the circuit contains anti-parallel sub-networks.

In other embodiments, the circuit is non-planar. In some preferred embodiments, the non-planar circuit exhibits electrical symmetry and the nodes which lie on the symmetry line equate in the even-mode equivalent circuit to either an open-circuit or cross-linked boundary condition, and equate in the odd-mode equivalent circuit to either a short-circuit or inverting transformer boundary condition.

In still other embodiments, two or more filters are cascaded, with output ports in place of one or more terminations at intermediate stages, realizing a multiplexer.

The filter may be one of low-pass, high-pass, band-pass, band-stop, all-pass, all-stop, or multi-band. The filter elements may be inductors, capacitors, resistors, resonators, cavities, or transmission lines.

Preferably, all or part of the filter may be printed monolithically on a circuit, a semiconductor substrate, a dielectric film, or a high-frequency laminate.

Preferably, the filter is implemented as one of a Monolithic Microwave Integrated Circuit, a thin-film printed circuit, a thick-film printed circuit, a Low-Temperature Co-fired Ceramic (LTCC) printed circuit, an integrated circuit, a semiconductor intellectual property core (IP core or IP block), or a discrete-element assembly.

In some embodiments, some or all of the filter elements may be synthesized from active circuits. The active circuits may comprise one or more transistors, differential pairs, operational amplifiers ("op-amps"), current-conveyors, Micro-Electro-Mechanical devices (MEMs), General Impedance Converters (GICs), and Negative Impedance Converters (NICs). The active circuits may employ feedback. The elements synthesized may be one or more of inductors, capacitors, and resistors, and they may have negative values. If the active circuits take the form of a NIC, the NIC may be one or more of a Current-Inverting Negative Impedance Converter (INIC) and a Voltage-Inverting Negative Impedance Converter (VNIC). The synthesized elements may be grounded or floating.

In some preferred embodiments, the filter may include an energy-harvesting circuit to absorb stop-band power incident upon the filter. The energy-harvesting circuit may be used to supply power to the active synthesized elements.

DESCRIPTION OF THE DRAWINGS

The invention is described in greater detail by way of example only and with reference to the attached drawings, in which:

FIG. 17A depicts a ripple factor selected for 30 dB stop-band rejection. FIG. 17B depicts a ripple factor selected for 45 dB stop-band rejection.

FIGS. 24A-F are illustrations of the boundary conditions associated with the even- and odd-mode equivalent circuits with and without crossovers.

FIGS. 25A-C are examples of how the boundary conditions of a circuit with a crossover may be simplified in specific cases of the even- and odd-mode equivalent circuit.

FIGS. 26A-B are an example of a non-planar reflectionless filter.

FIGS. 34A-D are examples of a reflectionless filter utilizing synthetic negative elements with FIG. 34A showing a reflectionless filter requiring two negative elements (circled in dotted lines), FIG. 34B showing one possible implementation of the grounded negative capacitor, FIG. 34C showing one possible implementation of the floating negative inductor, and FIG. 34D showing an implementation of the reflectionless filter with synthetic negative elements.

DETAILED DESCRIPTION

As embodied and broadly described herein, the disclosures herein provide detailed embodiments of the invention. However, the disclosed embodiments are merely exemplary of the invention that can be embodied in various and alternative forms. Therefore, there is no intent that specific structural and functional details should be limiting, but rather the intention is that they provide a basis for the claims and as a representative basis for teaching one skilled in the art to variously employ the present invention.

A problem in the art capable of being solved by the embodiments of the present invention is a circuit topology and design technique for electronic filters that are well-matched at all frequencies. It has been surprisingly discovered that such filters have a number of unexpected advantages, including minimal reflections on their input and output ports, either in their pass bands or stop bands, or the transition bands. The return loss for these filters is substantially infinite at all frequencies. In conventional filters, on the other hand, stop band rejection is achieved by reflecting the unwanted portion of the spectrum back toward the signal source rather than absorbing it. The instant filters are comprised of lumped element resistors, inductors, and capacitors, or of transmission line equivalents, and can be implemented in whatever form is suited to the application (e.g. waveguide, coaxial, wire-leaded, surface-mount, monolithically-integrated).

Figure 1:
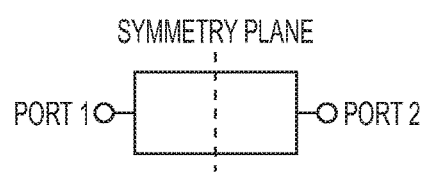
FIG. 1 is an arbitrary, symmetric, two-port network.

FIG. 1 depicts an arbitrary, symmetric, two-port network. While symmetry is not required of reflectionless filters, the preferred embodiment is symmetrical. In such a network, if both ports are excited simultaneously with equal signal amplitudes and matching phase, there will be no currents crossing from one side of the symmetry plane to the other. This is called the even-mode. Similarly, if the two ports are excited with equal amplitudes but 180° out of phase, then all nodes that lie on the symmetry plane should have zero electric potential with respect to ground. This is called the odd-mode.

Therefore, it is possible to have two single-port networks, each containing one half of the elements of the original two-port network, where the nodes that lie on the symmetry plane are either open-circuited or shorted to ground. These can be called the even-mode equivalent circuit and the odd-mode equivalent circuit, respectively. Equivalent circuits are circuits that retain all of the electrical characteristics of the original (and often more complex) circuits. The scattering parameters of the original two-port network are then given as the superposition of the reflection coefficients of the even- and odd-mode equivalent circuits, as follows:

$$s_{11}=s_{22}=\tfrac{1}{2}(\Gamma_{even}+\Gamma_{odd}) \quad (1)$$

$$s_{21}=s_{12}=\tfrac{1}{2}(\Gamma_{even}-\Gamma_{odd}) \quad (2)$$

wherein $s_{ij}$ is the scattering coefficient from port j to port i, and $\Gamma_{even}$ and $\Gamma_{odd}$ are the reflection coefficients of the even- and odd-mode equivalent circuits, respectively. Thus, the condition for perfect input match, $s_{11}=0$, is derived from (1) as follows:

$$\Gamma_{even}=-\Gamma_{odd} \quad (3)$$

This is equivalent to saying that the normalized even-mode input impedance is equal to the normalized odd-mode input admittance (or vice-versa):

$$z_{even}=y_{odd} \quad (4)$$

wherein $z_{even}$ is the normalized even-mode impedance, and $y_{odd}$ is the normalized odd-mode admittance, which is satisfied if the even- and odd-mode circuits are duals of each other (e.g. inductors are replaced with capacitors, shunt connections with series connections). Further, by combining (2) and (3), the transfer function of the original two-port network is given directly by the even-mode reflection coefficient:

$$s_{21}=\Gamma_{even} \quad (5)$$

Figure 2:
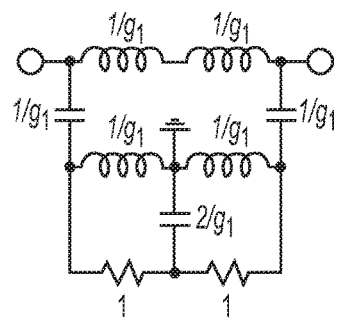
FIG. 2 is an example of a low-pass reflectionless filter, known in the prior art.
Figure 3:
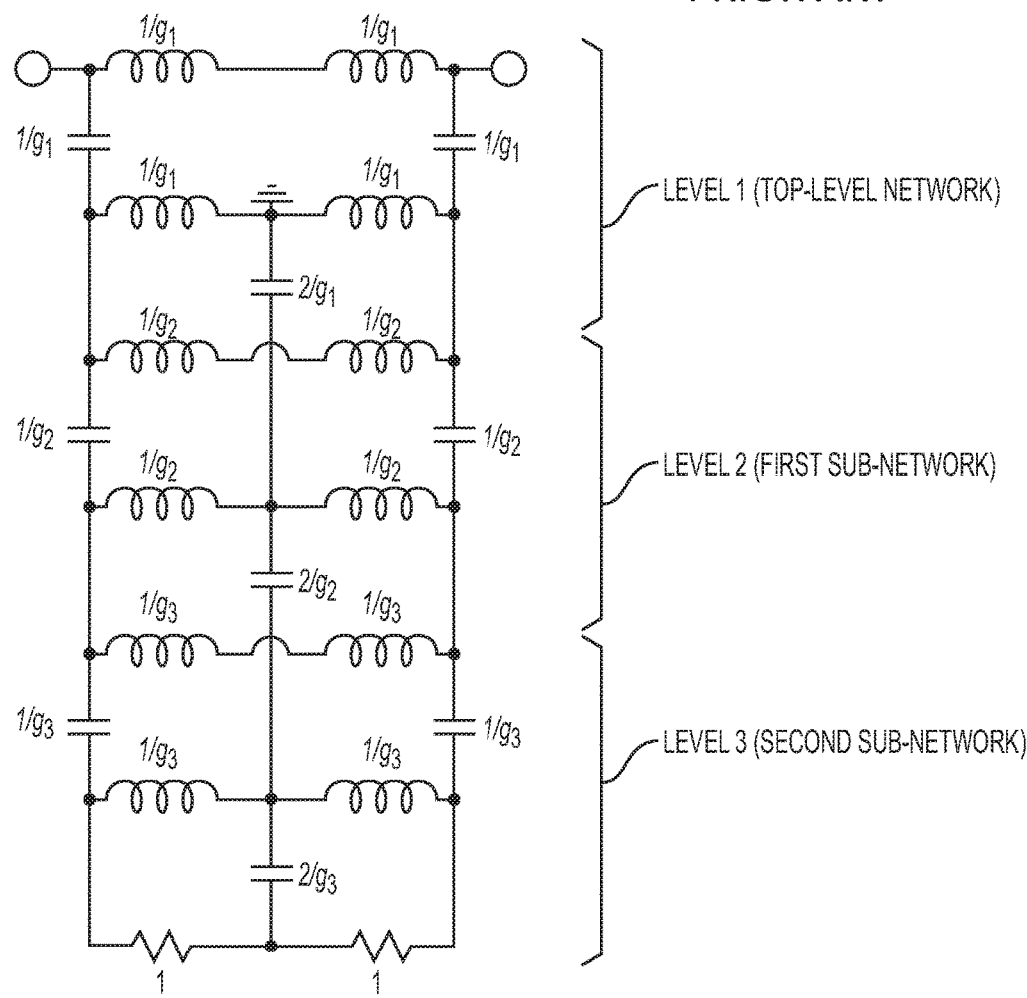
FIG. 3 is an example of a low-pass reflectionless filter, containing a sub-network within a sub-network, known in the prior art. The rank of this filter is 3.

Embodiments of the invention are directed to reflectionless filters. In the prior art (U.S. Pat. No. 8,392,495) a methodology for the design and development of reflectionless filters was taught. An example of one such reflectionless filter is shown in FIG. 2. Further prior art (U.S. patent application Ser. No. 14/724,976) taught that more sophisticated designs may be obtained by nesting filters inside one another as sub-networks, an example of which is shown in FIG. 3. These figures have been drawn in such a way that emphasizes the location of the sub-networks within the overall filter structure. In the prior art, the normalized values of the elements (normalized by the characteristic impedance as well as the cutoff frequency) within a given sub-network filter were equal, such that the sub-networks themselves were impedance-matched, or reflectionless. This is indicated by the labels in the Figures, and was a sufficient condition to guarantee that the filter as a whole would also be reflectionless.

With the present invention, it is shown that individual matching of the sub-networks, though sufficient, is not a necessary condition for the filter as a whole to be reflectionless. The root and sub-networks may in fact be intentionally mis-matched in a compensatory way such that the overall duality constraints are still met. (The "duality constraints" in this context refers to the substantial equivalence of the normalized even- and odd-mode equivalent circuit impedance and admittance, respectively.)

In one embodiment, the reflectionless filter comprises the topology of a simpler reflectionless filter with a sub-network inside a sub-network of additional reflectionless filters—that is, it comprises the topology only, but without the usual assignment of element values so that each sub-network meets the duality constraints on its own. Instead, preferably the network as a whole is constrained to meet the duality condition, but having additional degrees of freedom than if the sub-networks were to be made reflectionless independently.

Any number of sub-network topologies may be nested in this fashion. The number of filter topologies nested, including the top-level network, determines the rank of the filter. With the additional degrees of freedom afforded by the generalization of element values, the filter response may be tuned to that of classically-optimized filters, such as the Chebyshev equal-ripple or Zolotarev configuration. In some preferred embodiments, the order of the optimal response can be one plus twice the rank of the filter.

Figure 4A:
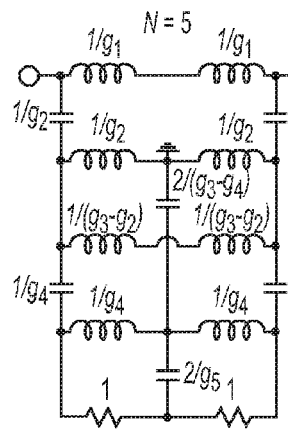
FIGS. 4A-C show shows examples of low-pass reflectionless filters with generalized element values from unmatched sub-networks capable of realizing a Chebyshev equal-ripple response.
Figure 4B:
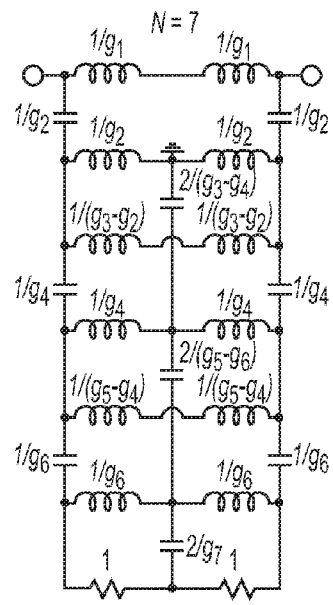
Figure 4C:
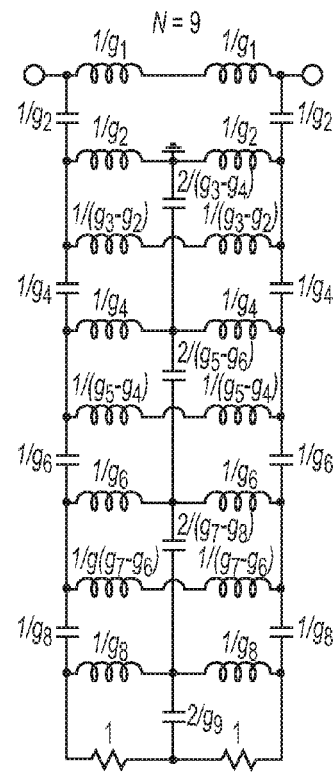
Figure 5A:
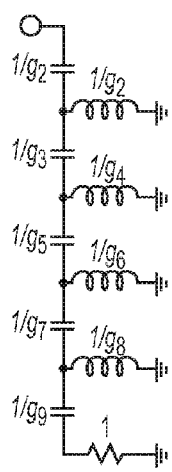
FIGS. 5A-B show shows the even- and odd-mode equivalent circuits for the case N=9, respectively.
Figure 5B:
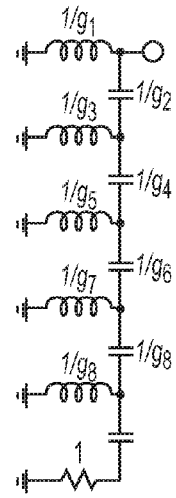

A few examples of low-pass reflectionless filters with the aforementioned generalized element values are shown in FIGS. 4A-C. The even- and odd-mode equivalent circuits where N=9 are shown in FIGS. 5A-B. The customary prototype parameters, $g_k$, are inverted in this diagram because the even- and odd-mode equivalent circuits are high-pass filters, even though the full reflectionless filter itself is low-pass, as taught in the prior art (U.S. Pat. No. 8,392,495). As the figure shows, in order to meet the duality constraints with these networks, preferably $g_1=g_2$ and $g_N=g_{N-1}$, where N is the order of the filter response. That condition can be met with Chebyshev equal-ripple prototype parameters. The formulae for deriving those parameters are well known, but it is useful to repeat them here, $$\beta = \ln\left(\coth\left(\frac{1}{4}\ln(1+\varepsilon^2)\right)\right) \quad (6a)$$

$$\gamma = \sinh\left(\frac{\beta}{2N}\right) \quad (6b)$$

$$a_k = \sin\left(\frac{(2k-1)\pi}{2N}\right), \text{ for } k = 1 \ldots N \quad (6c)$$

$$b_k = \gamma^2 + \sin^2\left(\frac{k\pi}{N}\right), \text{ for } k = 1 \ldots N \quad (6d)$$

$$g_1 = \frac{2a_1}{\gamma} \quad (6e)$$

$$g_k = \frac{4a_{k-1}a_k}{b_{k-1}g_{k-1}}, \text{ for } k = 2 \ldots N. \quad (6f)$$

In these equations, ε is known as the ripple factor. In the case of a Chebyshev Type II filter, where the pass-band is monotonic and the ripples appear in the stop-band, the peaks of the stop-band then occur at $s_{21}=\varepsilon/\sqrt{(1+\varepsilon^2)}$. In this embodiment, in order to ensure that $g_1=g_2$, we may solve for the ripple factor as follows, $$g_1 = g_2 = \frac{4a_1a_2}{b_1g_1} \quad (7a)$$

$$g_1^2 = \frac{4a_1a_2}{b_1} = \frac{4a_1^2}{\gamma^2} \quad (7b)$$

$$\frac{a_2}{b_1} = \frac{a_1}{\gamma^2} \quad (7c)$$

$$\frac{\sin\left(\frac{3\pi}{2N}\right)}{\gamma^2 + \sin^2\left(\frac{\pi}{N}\right)} = \frac{\sin\left(\frac{\pi}{2N}\right)}{\gamma^2} \quad (7d)$$

$$\gamma = \sqrt{\frac{\sin\left(\frac{\pi}{2N}\right)\sin^2\left(\frac{\pi}{N}\right)}{\sin\left(\frac{3\pi}{2N}\right) - \sin\left(\frac{\pi}{2N}\right)}} \quad (7e)$$

$$\beta = 2N\sinh^{-1}(\gamma) \quad (7f)$$

$$\varepsilon = \sqrt{e^{4\tanh^{-1}(e^{-\beta})} - 1}. \quad (7g)$$

The same ripple factor is sufficient in this embodiment to ensure that $g_N=g_{N-1}$. The full list of prototype parameters, then, for this embodiment and a number of different orders, N, is tabulated in Table I.

TABLE I

Prototype Element Values for Chebyshev Filters

| N | ε | $g_1$ | $g_2$ | $g_3$ | $g_4$ | $g_5$ | $g_6$ | $g_7$ | $g_8$ | $g_9$ | $g_{10}$ | $g_{11}$ | $g_{12}$ | $g_{13}$ |
|---|---|---|---|---|---|---|---|---|---|---|---|---|---|---|
| 3 | 0.1925 | 1.155 | 1.155 | 1.155 | | | | | | | | | | |
| 5 | 0.2164 | 1.337 | 1.337 | 2.164 | 1.337 | 1.337 | | | | | | | | |
| 7 | 0.2187 | 1.377 | 1.377 | 2.280 | 1.498 | 2.280 | 1.377 | 1.377 | | | | | | |
| 9 | 0.2192 | 1.392 | 1.392 | 2.315 | 1.531 | 2.378 | 1.531 | 2.315 | 1.392 | 1.392 | | | | |
| 11 | 0.2194 | 1.400 | 1.400 | 2.330 | 1.544 | 2.407 | 1.561 | 2.407 | 1.544 | 2.330 | 1.400 | 1.400 | | |
| 13 | 0.2194 | 1.404 | 1.404 | 2.338 | 1.550 | 2.420 | 1.572 | 2.433 | 1.572 | 2.420 | 1.550 | 2.338 | 1.404 | 1.404 |

Figure 6A:
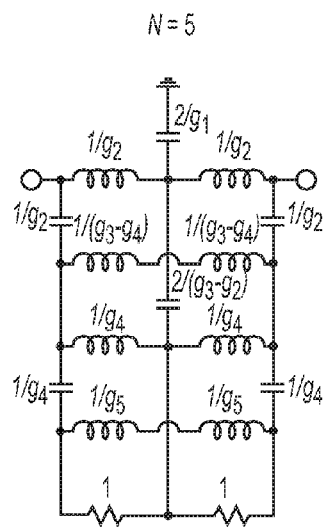
FIGS. 6A-C show shows the duals of the low-pass reflectionless filters in FIGS. 4A-C, respectively.
Figure 6B:
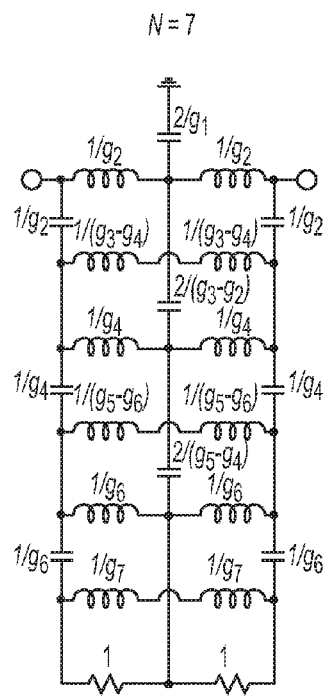
Figure 6C:
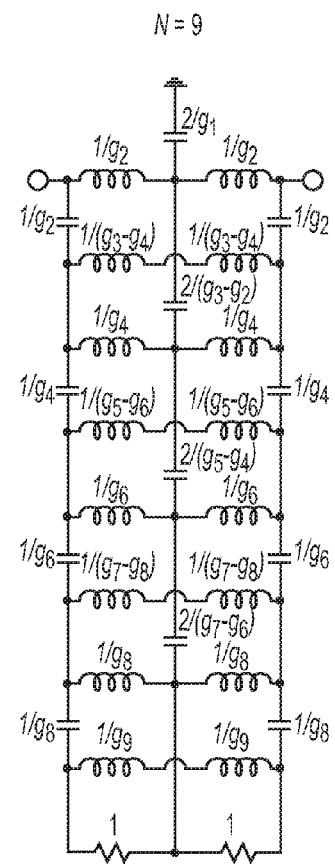
Figure 7:
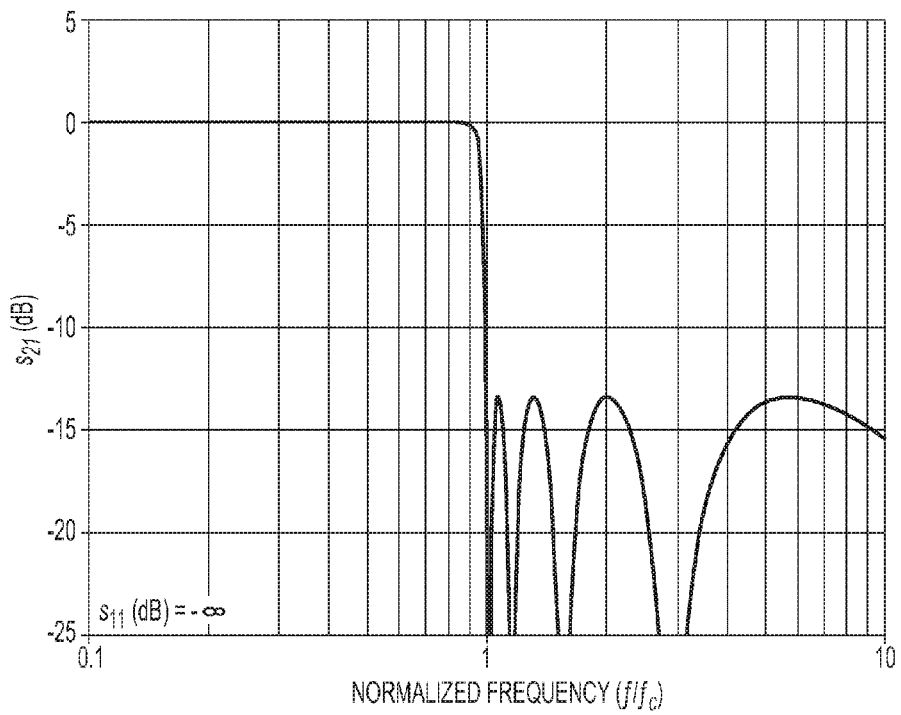
FIG. 7 is a plot of the frequency response of the reflectionless filters in FIGS. 5A through 6C for N=9, when the element values correspond to those of a Chebyshev equal-ripple prototype.

As with all reflectionless filters, there is a dual for each network that has the same frequency response, shown in FIGS. 6A-C. The frequency response itself for N=9 is shown in FIG. 7.

Figure 8:
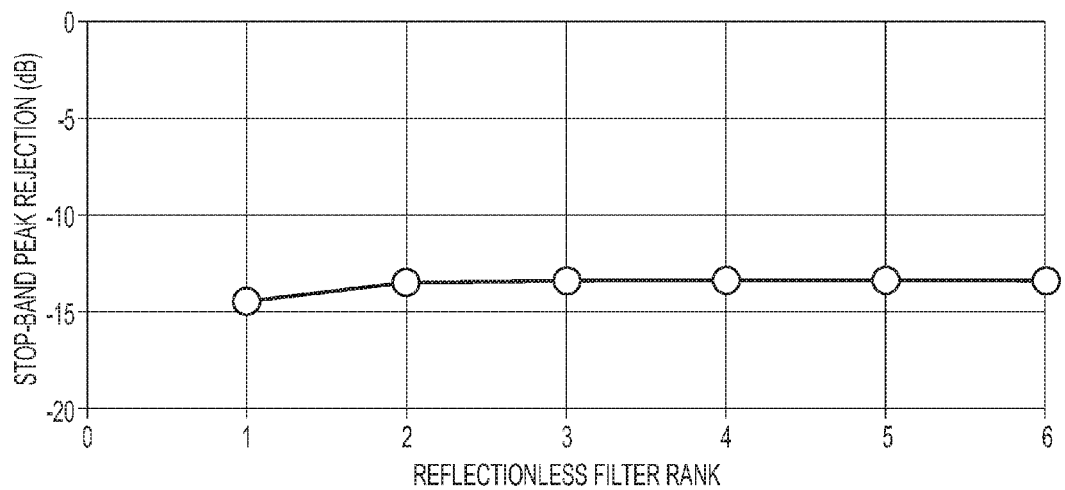
FIG. 8 is a plot of the peak stop-band rejection that can be achieved with the filters in FIGS. 5A through 6C as a function of filter rank.
Figures 9A, 9B, 9C:
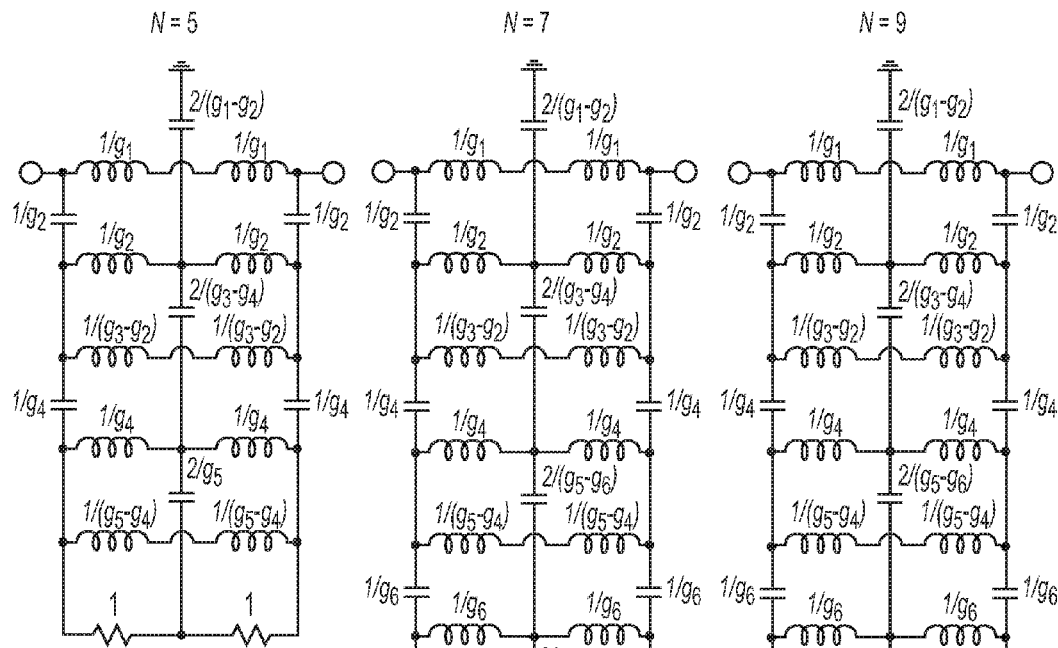
FIGS. 9A-C show low-pass reflectionless filters with additional elements designed to permit additional degrees of freedom in the assignment of element values.
Figures 10A, 10B, 10C:
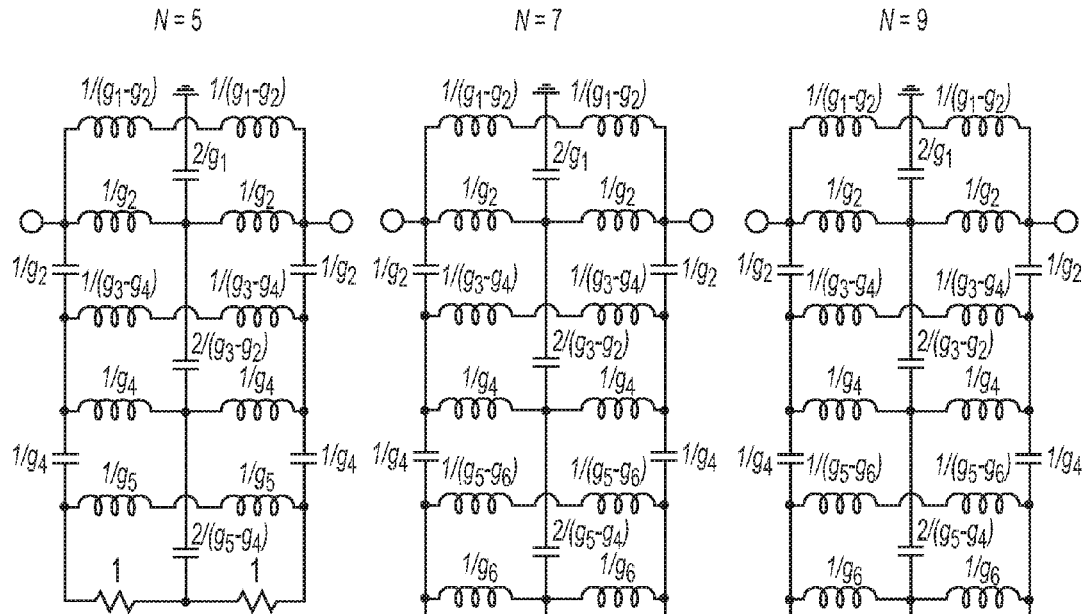
FIGS. 10A-C show the duals of the low-pass reflectionless filters in FIGS. 9A-C, respectively.
Figure 11:
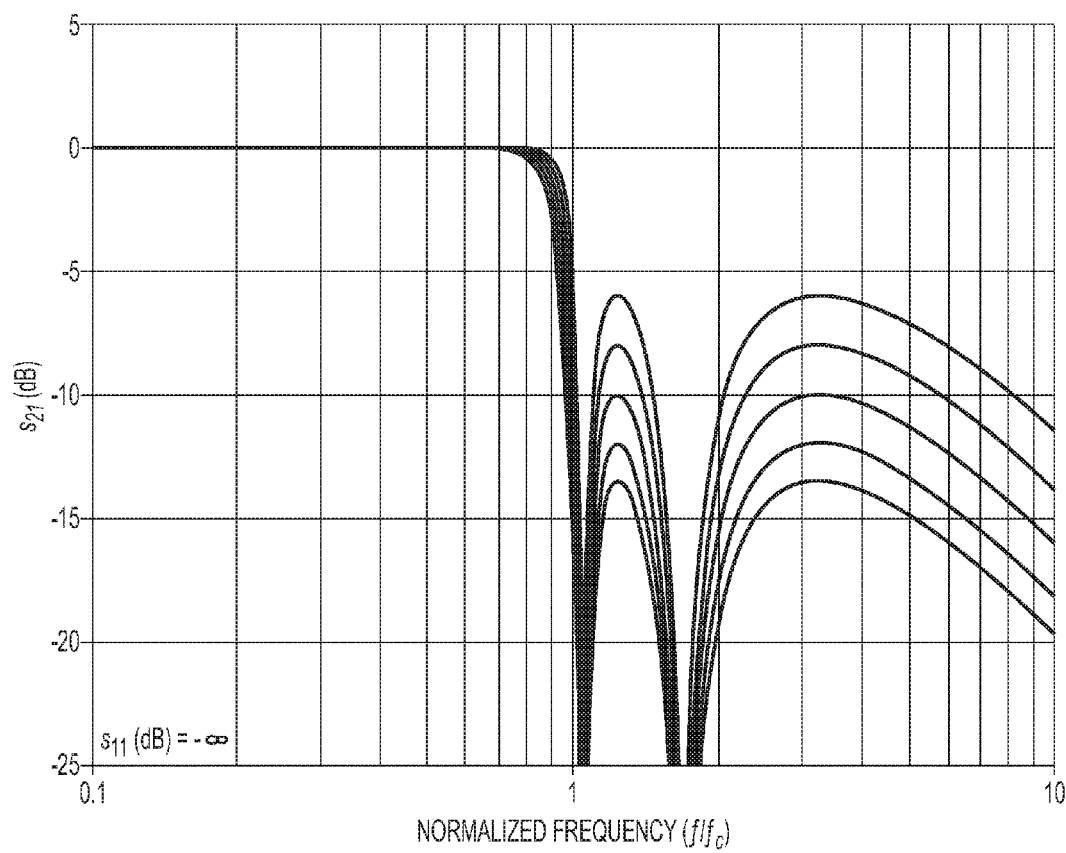
FIG. 11 is a plot of the frequency response of the low-pass reflectionless filters of FIGS. 9A through 10C for order N=5, with several ripple factors.
Figure 12A:
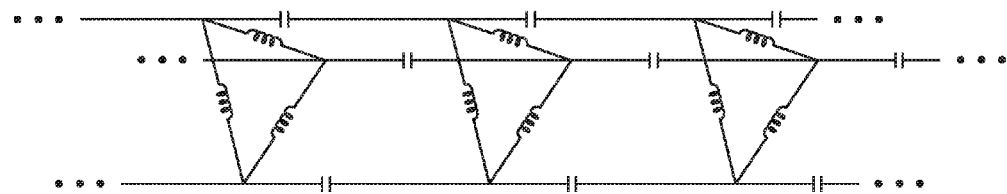
FIGS. 12A-D are illustrations of the cascade patterns for the reflectionless filters in FIGS. 4A-C, 6A-C, 9A-C, and 10A-C, transformed for low-pass, high-pass, band-pass, and band-stop responses, and re-drawn so as to make the repeating pattern more clear.
Figure 12B:
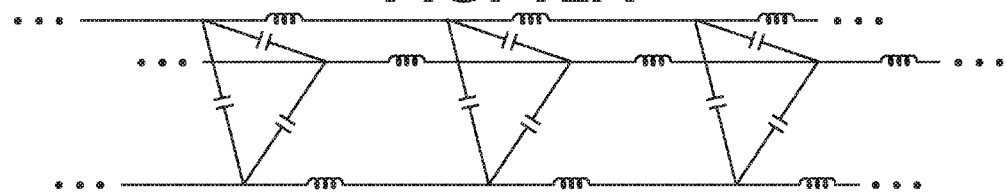
Figure 12C:
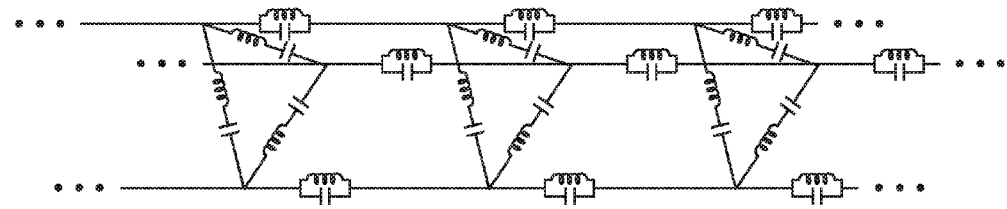
Figure 12D:
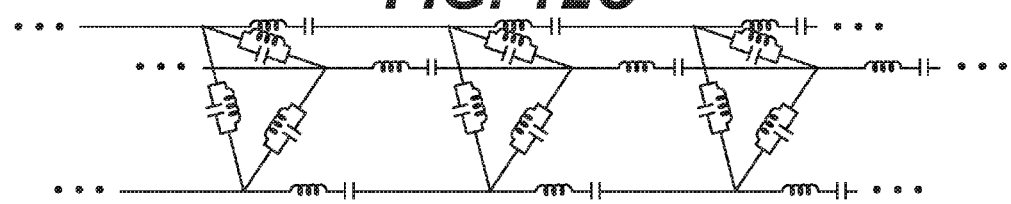

In the previous embodiment, the ripple factor is constrained by the need to maintain equality of the first and second prototype element values, as well as the last and second-to-last elements. This maximum stop-band rejection is plotted as function of filter rank in FIG. 8. In a preferred embodiment, that constraint may be removed with the addition of a few elements, as shown in FIGS. 9A-C, and their duals in FIGS. 10A-C. This allows one to select the ripple factor to achieve a desired stop-band ripple. In a preferred embodiment, the prototype element values may be calculated using the well-known formulas for Chebyshev filters in Eq. (6). The results for several ripple factors are shown in FIG. 11.

Well-known transformation techniques allow the low-pass prototypes described herein to be converted to high-pass, band-pass, band-stop, all-pass, all-stop, and even multi-band implementations. These transformations involve the substitution of reactive elements with other kinds of reactive elements or resonators.

In several embodiments, including those of the circuits in FIGS. 4A-C and 9A-C, as well as their duals in FIGS. 6A-C and 10A-C, the topology of the reflectionless filter follows the same repeating pattern, differing only by the points at which the chain of elements is terminated by the ports at one end and the absorptive elements at the other. These patterns are shown in FIGS. 12A-D, re-drawn in such a way as to make the repeating configuration of elements more clear.

In other embodiments, as with other reflectionless filters of the prior art, the terminations may be replaced with other forms of loads, such as tapered loads, antennas, isolators, or other sub-networks having any configuration. In certain preferred embodiments, these sub-networks will be matched.

Figure 13:
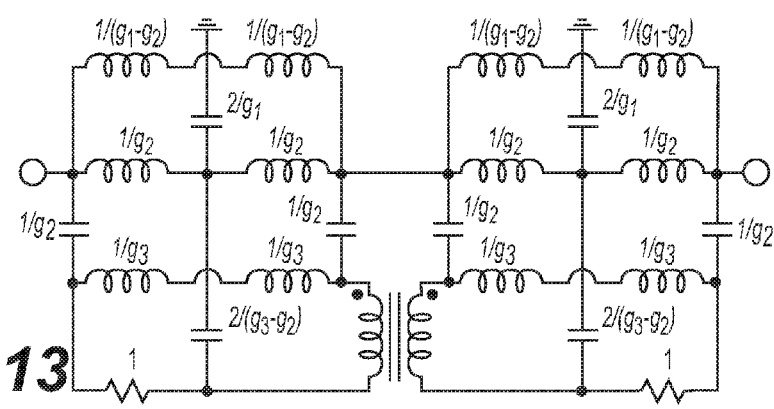
FIG. 13 is a schematic for a cascade of two first-rank (N=3) reflectionless filters with generalized element values, and cross-connected with a sub-network that comprises a transformer.
Figure 14:
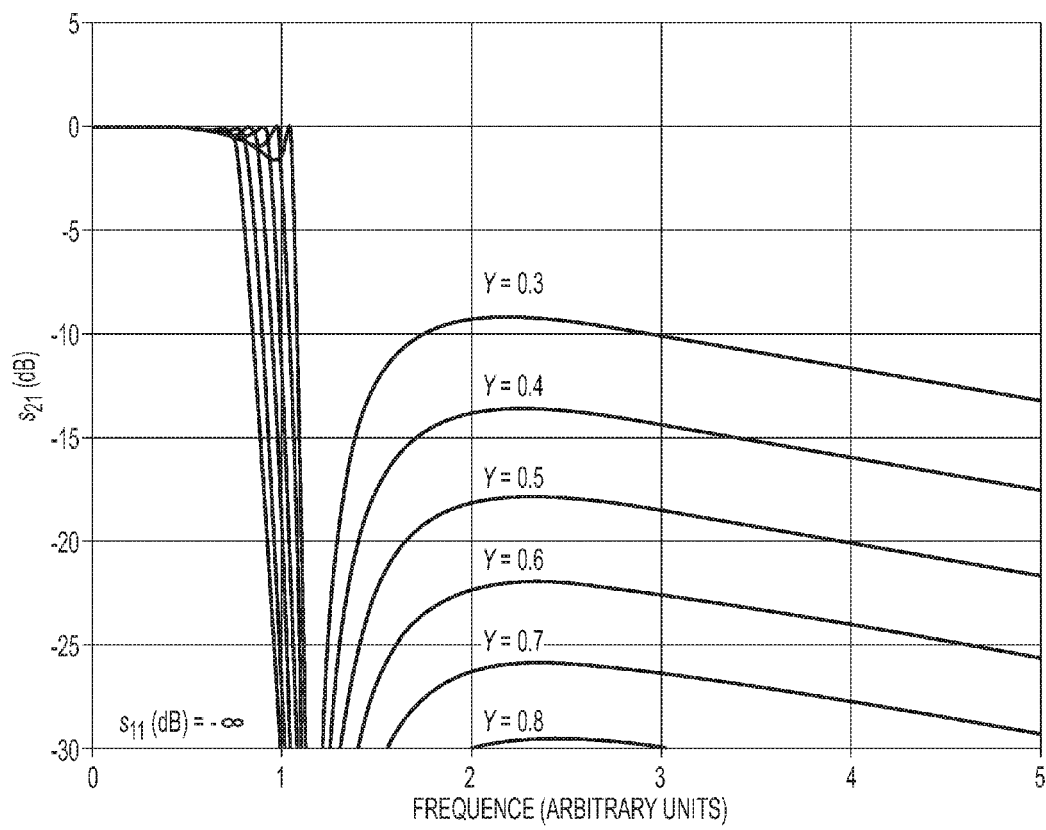
FIG. 14 is a plot of the frequency response for the filter in FIG. 13, wherein the element values correspond to those of a Chebyshev equal-ripple prototype, and for a range of values for the parameter, $\gamma$.

In still other embodiments, as with other reflectionless filters of the prior art, two or more reflectionless filters may be cascaded, and the internal terminations of the cascaded filters may be cross-connected by a matched sub-network. An example is shown in FIG. 13, wherein the two cascaded filters are third order, using the auxiliary elements and generalized element values described by this invention. Preferably, the combined application of these generalized topologies with other techniques of the prior art yield filters with ripple in both the pass-band and stop-band, in what may be referred to as a quasi-elliptical response. FIG. 14 shows the simulated quasi-elliptical performance of the filter in FIG. 13 with Chebyshev parameter values for $\gamma$ ranging from 0.3 to 0.8.

Figure 15:
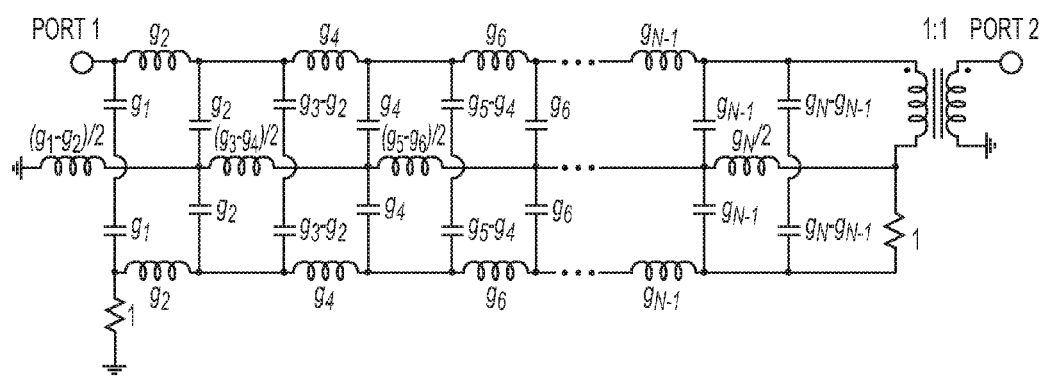
FIG. 15 is a schematic for a reflectionless filter utilizing a second port in place of a termination resistor, where the second port is coupled out via a transformer.
Figure 16:
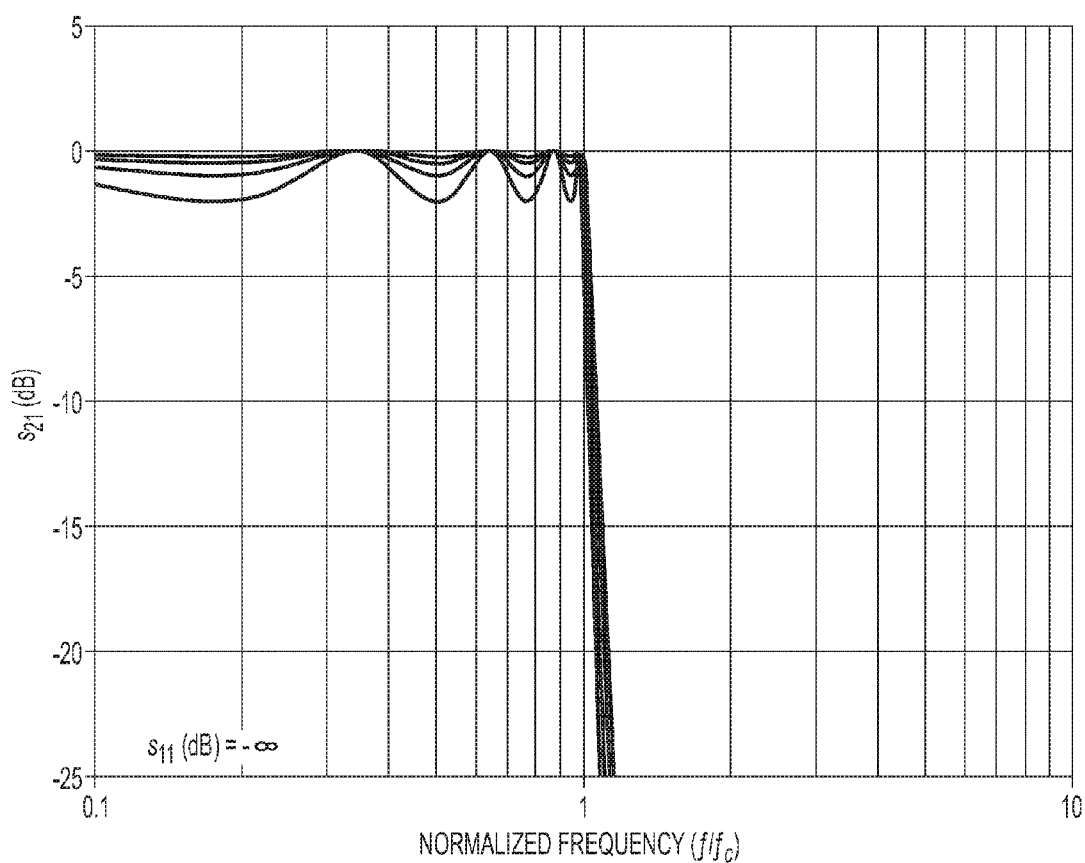
FIG. 16 is a plot of the frequency response for the filter in FIG. 15, wherein the element values correspond to those of a Chebyshev equal-ripple prototype, for order N=9 with several ripple factors.

Similarly, in some embodiments, the terminations of a reflectionless filter may be replaced by external ports. In some embodiments, these additional ports may be differential, and converted to single-ended ports with a balun or transformer. An example of one such embodiment is shown in FIG. 15. Preferably, the frequency response of such an embodiment is a Chebyshev Type I response, having ripple in the pass-band, as shown in FIG. 16.

Figure 17A:
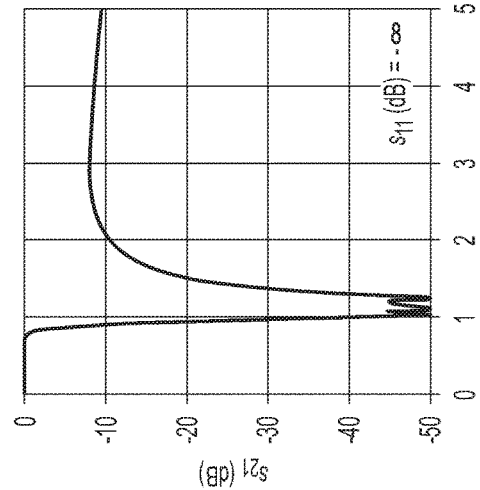
FIGS. 17A-B are plots of the frequency response for the filters in FIGS. 9A through 10C, wherein the element values correspond to those of a Zolotarev prototype, for order N=7.
Figure 17B:
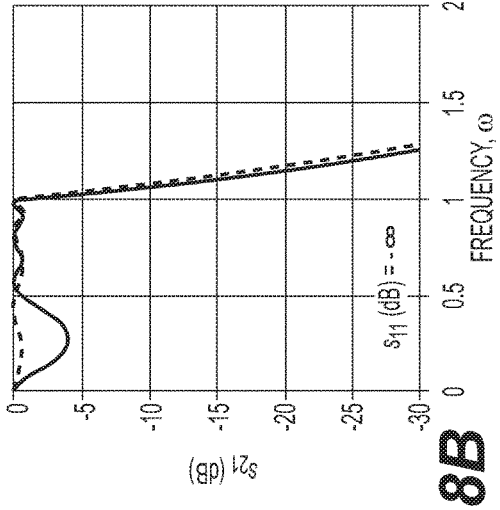
Figure 18A:
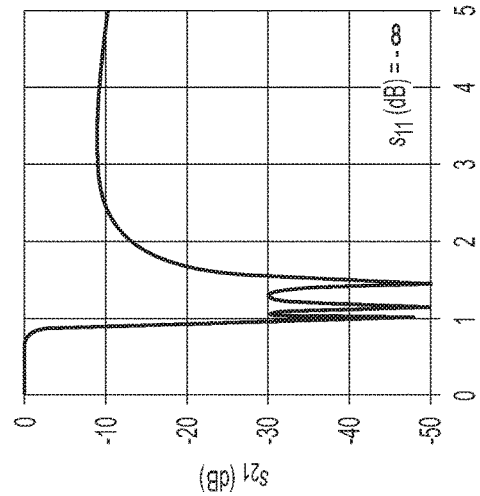
FIG. 18A is Schematic of a reflectionless Zolotarev Type I topology.
Figure 18B:
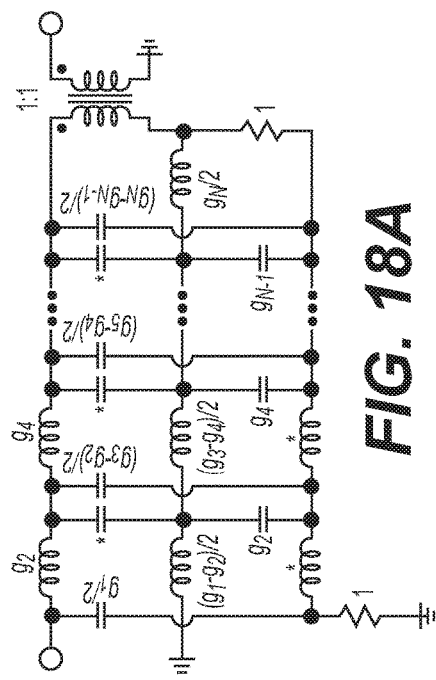
FIG. 18B is a plot of the frequency response for order N=7, wherein $\varepsilon=0.3493$ and $\lambda=0.5$. The thin line shows a Chebyshev Type I filter using the same topology and the same ripple factor for comparison.

Though the Chebyshev equal response is among the most well-known, the range of optimized filter responses that can be achieved with the topologies of this invention is much broader. In some embodiments, the element values may preferably be assigned to yield a Zolotarev response. The Zolotarev response is similar to the Chebyshev response, in that it has mostly equal ripples in the pass-band or stop-band, but it differs in that one ripple, closest to the origin for a low-pass filter, is allowed to be larger than the rest. In addition to the ripple factor, $\varepsilon$, which applies to the remainder of the ripples, Zolotarev filters have an additional parameter, $\lambda$, which determines the fraction of the ripple band-width that is occupied by the larger-than-nominal ripple. If the ripples appear in the stop-band, it may be called a Zolotarev Type II filter (analogous to the Chebyshev Type II). Two examples are shown in FIGS. 17A-B. Either of these responses may be achieved using the topologies in FIGS. 9A through 10C. If the ripples appear in the pass-band, it may be called a Zolotarev Type I filter, an example of which is shown in FIG. 18A. The topology in FIG. 18A is the same as that used for the Chebyshev Type I filters, only the element values are different. Despite this change in element values, the reflectionless property remains intact.

Figures 19, 20:
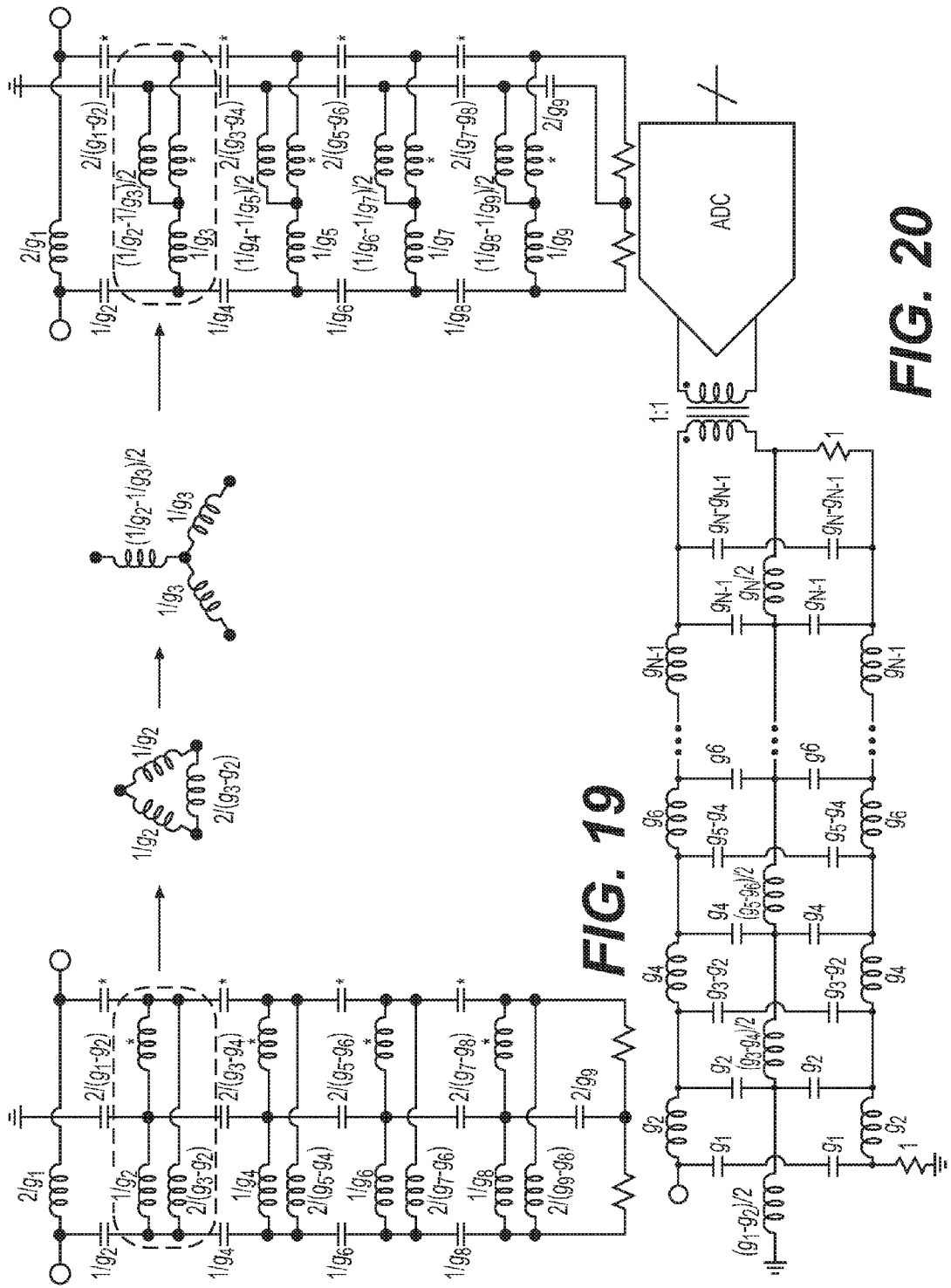
FIG. 19 is an illustration of a delta-wye transformations applied to the original filter topology ($9^{th}$-order example).
FIG. 20 is a schematic of a reflectionless filter used as an anti-aliasing filter driving and analog-to-digital converter having differential inputs.

In some embodiments, some of the elements may be modified by an equivalent-impedance transformation, such as the delta-wye transformations illustrated in FIG. 19. Preferably, these transformations yield elements with more moderate values than the original filter, thereby easing the practical implementation and improving realized performance via reduced parasitics.

In a preferred embodiment, the differential output of a reflectionless filter may be coupled to the differential input of an analog-to-digital converter through a balun or transformer, as in FIG. 20. In yet another embodiment, the balun or transformer may not be required, but the connection between the filter and the converter may be a direct connection.

Figure 21A:
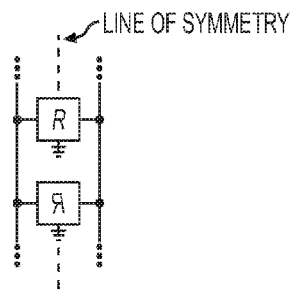
FIG. 21A Conceptual illustration of anti-parallel sub-networks.
Figure 21B:
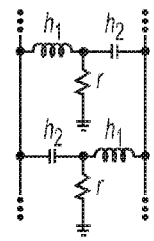
FIG. 21B is a specific example of a pair of anti-parallel sub-networks.
Figure 22A:
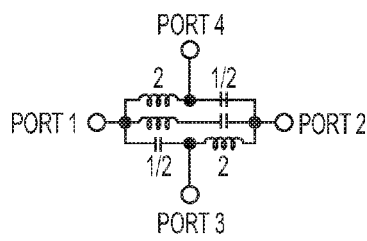
FIGS. 22A-B depict an example of reflectionless filter which employs anti-parallel sub-networks.
Figure 22B:
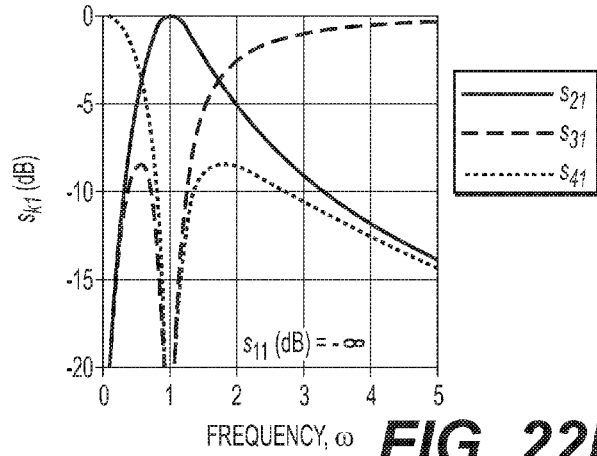

In some embodiments, the reflectionless filter is symmetric both topologically as well as electrically. Topological symmetry refers to the substantial equivalence of a network drawing with its mirror image about some axis of symmetry. In contrast, electrical symmetry requires only that the circuit behavior, as measured at the ports, is unchanged given that those ports are exchanged about some symmetry axis. In some embodiments, the reflectionless filter may be electrically symmetric without being topologically symmetric. One such embodiment comprises anti-parallel sub-networks, as illustrated conceptually in FIG. 21A, and by way of example in FIG. 21B. While the circuit may still be broken down into even- and odd-mode equivalent circuits, the open- and short-circuit boundary conditions described above for topologically symmetric circuits may not apply. Instead the structure of the even- and odd-mode equivalent circuits may be derived by direct application of mathematical impedance and admittance calculations under even- and odd-mode excitations. Alternatively, an anti-parallel pair of sub-networks may be converted into a topologically symmetric ensemble by means of equivalent impedance transforms, such as the delta-wye transformation. In some cases, the elements of the even- and odd-mode equivalent circuit may not correspond to physically realizable elements. An example of a reflectionless filter employing anti-parallel sub-networks is shown in FIGS. 22A-B.

Figure 23:
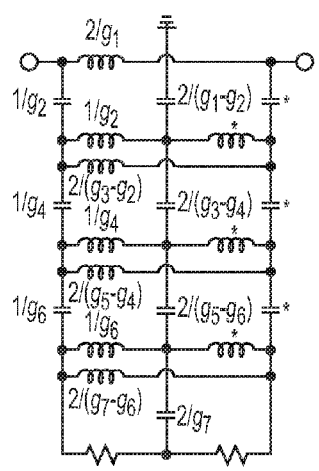
FIG. 23 is an example of a planar reflectionless filter drawn with and without crossovers.
Figure 23:
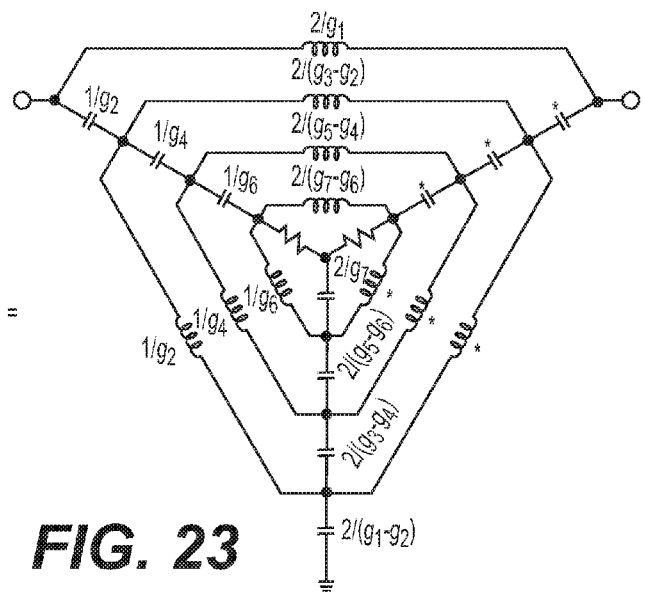

In some embodiments, the filter may be planar, meaning that it is possible to draw it on a flat sheet of paper without crossovers. Consider the filter topology shown in FIG. 23. The original drawing contains crossovers, but it is possible to redraw it in such a way that the crossovers are avoided. This circuit is planar.

In other embodiments, the circuit is non-planar. It is not possible to draw it on a flat page without having crossovers, or otherwise modifying the circuit via equivalent impedance transformations such that it becomes planar. Non-planar reflectionless filters may be designed using the even-/odd-mode analysis technique described above, but different boundary conditions are required, as illustrated in FIGS. 24A-F. Nodes that cross the symmetry line without crossing over one another (the top two pins in the drawing) equate to open-circuits in the even-mode equivalent circuits, and virtual shorts in the odd-mode equivalent circuit. Nodes that do crossover one another at the line of symmetry however (such as the bottom two pins in the drawing), become linked to one another in the even-mode equivalent circuit, but become connected through an inverting transformer in the odd-mode equivalent circuit. Depending on other elements of the topology, it may be possible to simplify the even- or odd-mode equivalent circuits further, such as illustrated in FIGS. 25A-C where the inverting transformer is ultimately removed.

FIGS. 26A-B are an example of a non-planar reflectionless filter.

Figure 27:
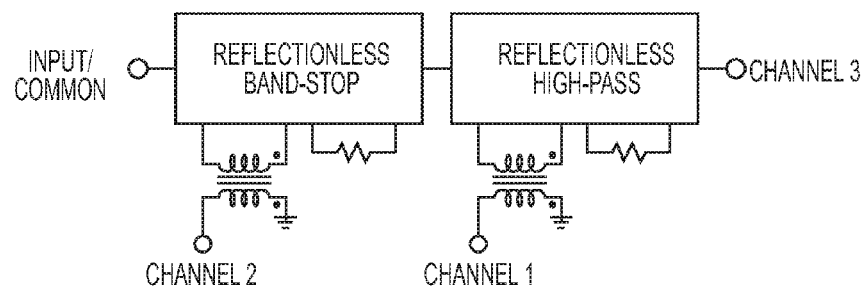
FIG. 27 is a block diagram of a multiplexer built up from cascaded reflectionless filters.
Figure 28:
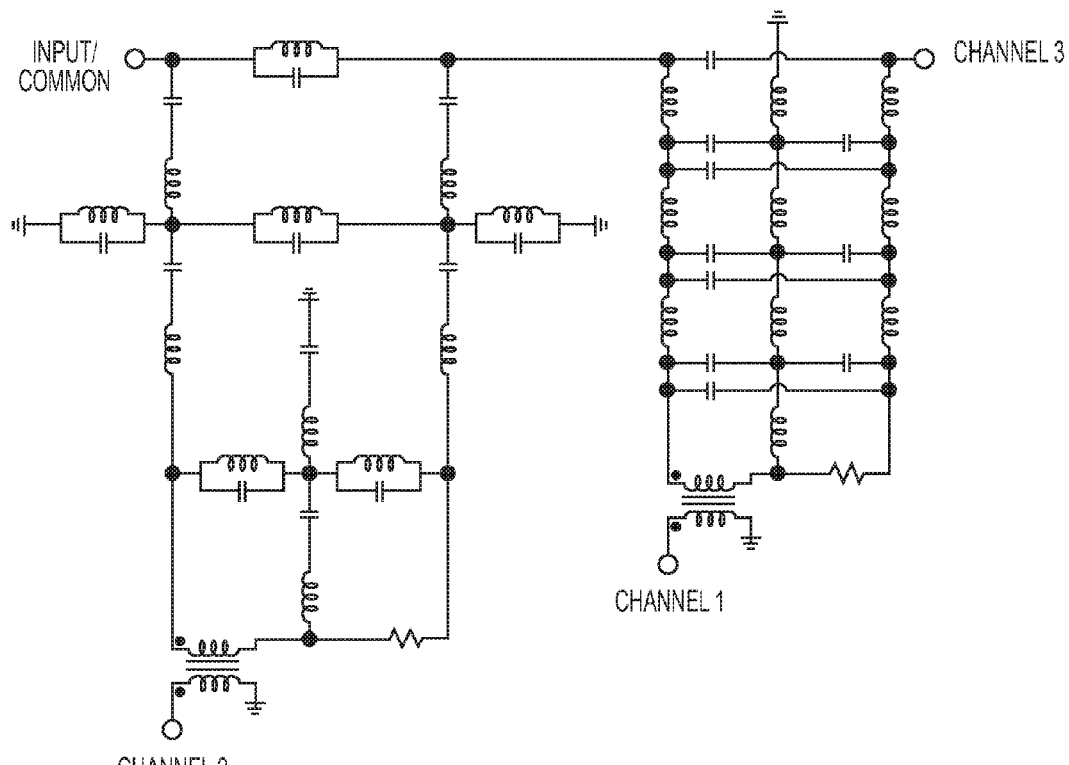
FIG. 28 is a schematic of the multiplexer in FIG. 27.
Figure 29:
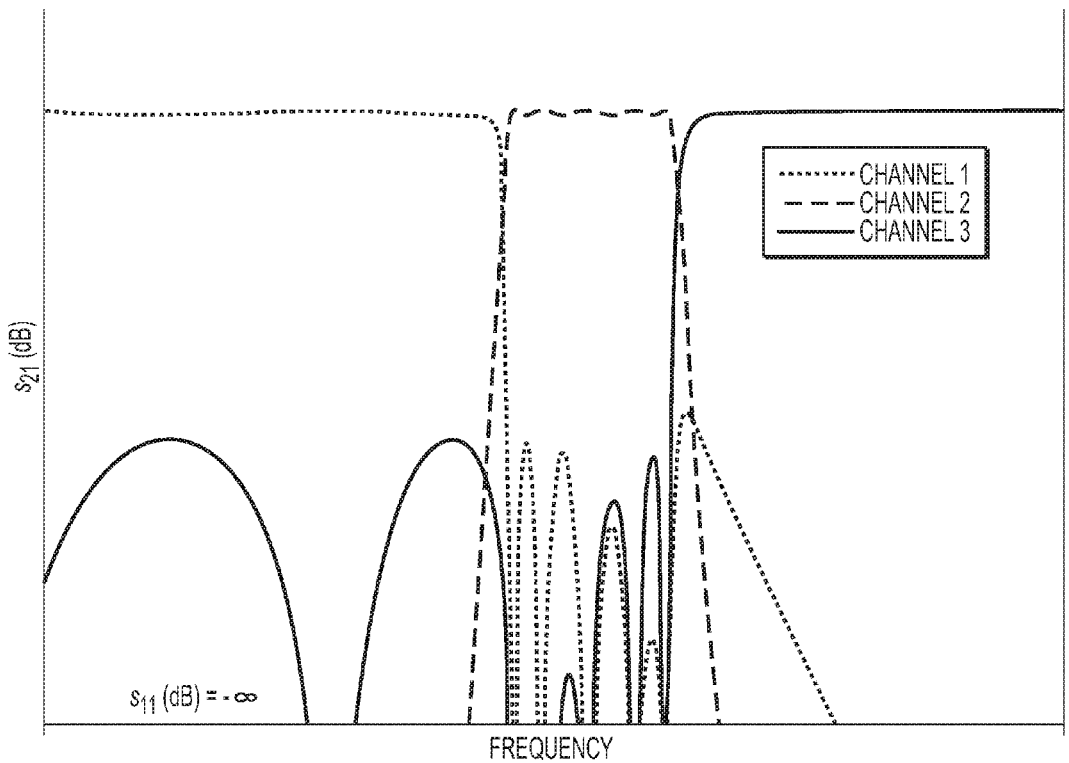
FIG. 29 is a plot of the frequency response of the multiplexer in FIG. 28.

In other embodiments, multiple reflectionless filters may be cascaded with some of their terminations replaced by external ports, thus implementing a multiplexer. FIG. 27 is a block diagram, showing one example where the cascaded filters are band-stop and high-pass. An example schematic of this multiplexer is shown in FIG. 28, and a possible frequency response in FIG. 29. In other embodiments, the ports cascaded and the ports used as multiplexer outputs may be single-ended, or differential, or a combination of both.

Figure 30A:
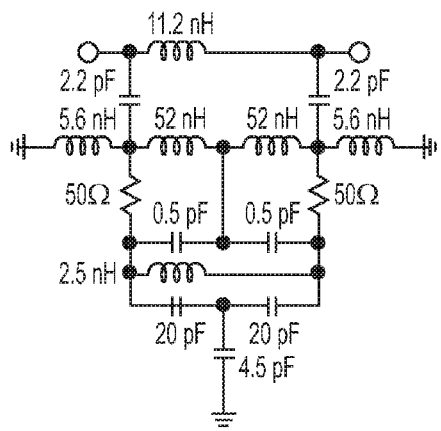
FIGS. 30A-B are an example of a pseudo-elliptical reflectionless filter.
Figure 30B:
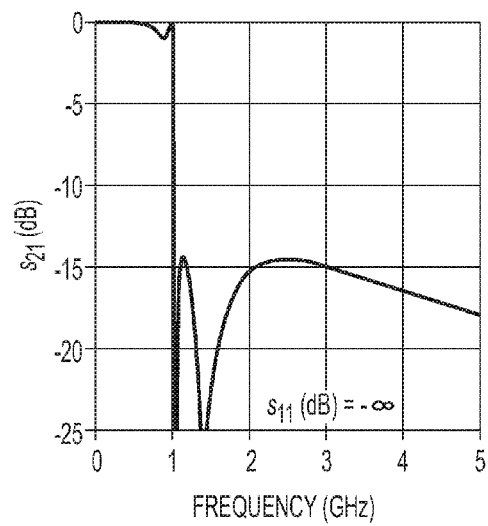

In some embodiments, the reflectionless filter may realize a pseudo-elliptical response, as illustrated in FIGS. 30A-B.

Figure 31A:
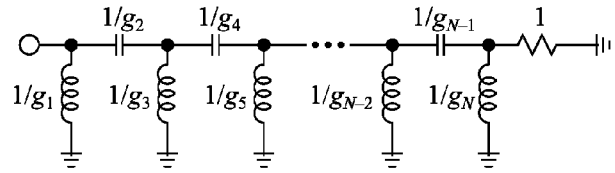
FIGS. 31A-B show the even- and odd-mode equivalent circuits for the filter topologies in FIGS. 9A through 10C.
Figure 31B:
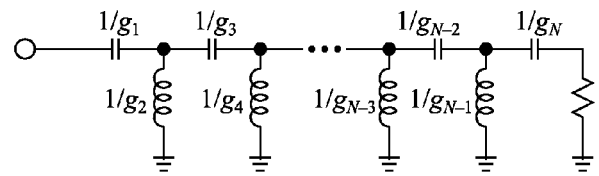

The even-mode equivalent circuit for the filter topologies in FIGS. 9A through 10C, for arbitrary order, are shown for clarity in FIG. 31A. It comprises a ladder topology of alternating series and parallel elements, terminated with a resistor. Note that, unlike the prior art in U.S. Pat. No. 8,392,495 and application Ser. No. 14/724,976, the reactive element values are not constrained by duality conditions. Whereas the first two elements of the even-mode equivalent circuit of FIG. 5 are required to be equal (having normalized value $1/g_2$), all of the elements in FIG. 31A are fully independent of one another. The odd-mode equivalent circuit, FIG. 31B, is simply the dual of the even-mode equivalent circuit.

In some preferred embodiments, however, the realization of these even- and odd-mode equivalent circuits may require elements in the original topology that are negative in value, e.g. $1/(g_1-g_2)$ where $g_2 > g_1$. In these embodiments, it is preferable to synthesize the negative elements using active circuits. In some embodiments, the positive elements may be synthesized by active circuits as well. The active circuits used to synthesize some elements may comprise transistors, differential pairs, operational amplifiers ("op-amps"), current-conveyors, Micro-Electro-Mechanical devices (MEMs), General Impedance Converters (GICs), and Negative Impedance Converters (NICs). In some preferred embodiments, the active circuits employ feedback. The feedback can be positive, or negative, or both.

Figure 32:
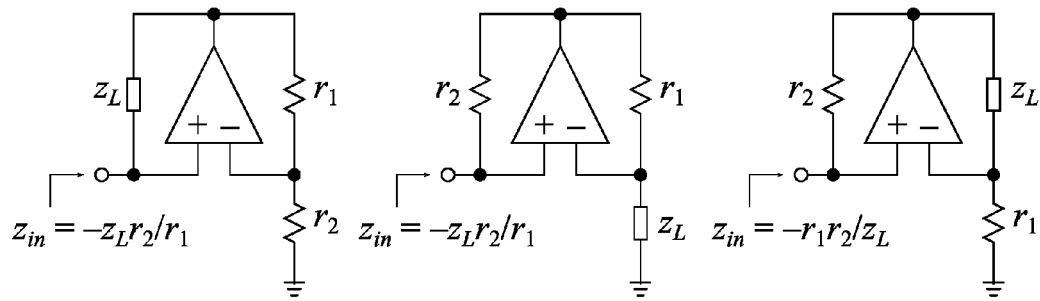
FIG. 32 shows examples of some current-inversion negative impedance converters (INICs, top) and voltage-inverting negative impedance converters (VNICs, bottom).
Figure 33:
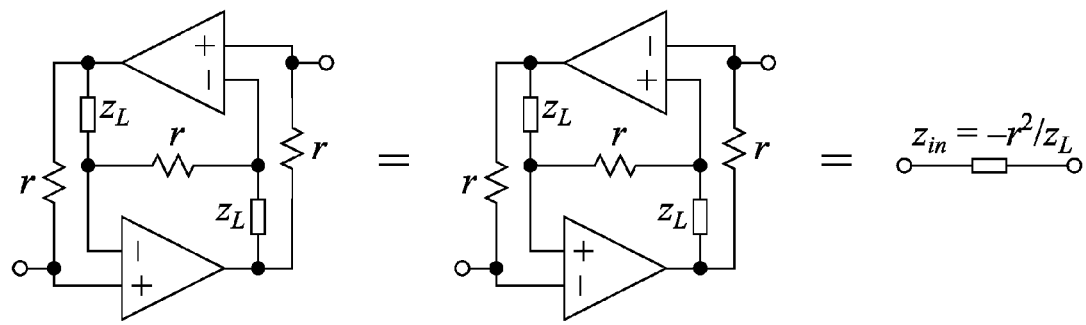
FIG. 33 shows examples of synthetic floating negative elements.
Figure 34A:
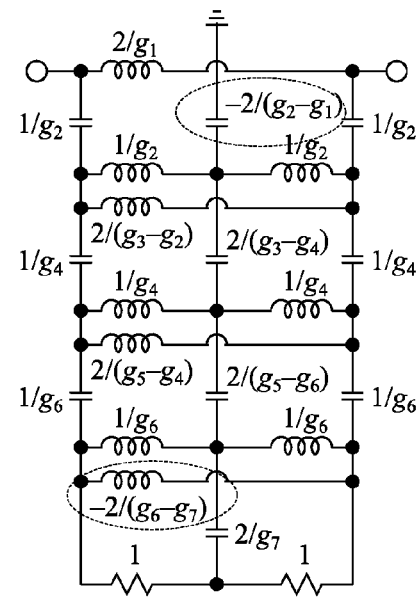
Figure 34B:
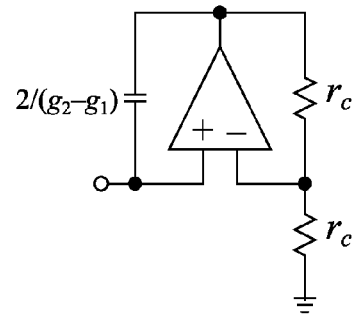

In a preferred embodiment, the active circuits used to synthesize some elements may be a Negative Impedance Converter (NIC). Impedance Converters can be both current-inverting (INIC) or voltage-inverting (VNIC) negative impedance converters. Although there are many possible configurations of NICs, some examples are shown in FIG. 32. The examples shown are sufficient to synthesize grounded elements. In some embodiments, floating elements are required. Examples of floating negative impedance elements are shown in FIG. 33.

In some preferred embodiments, the reflectionless filter requires at least one grounded negative capacitor, and at least one floating negative inductor. An example of such an embodiment and its realization using negative impedance converters is given in FIGS. 34A-D.

In a preferred embodiment, the reflectionless filter along with any synthetic elements, negative or positive, are fabricated monolithically on a Silicon integrated circuit.

In another preferred embodiment, the filter may include an energy-harvesting circuit which absorbs stop-band energy incident upon the filter. This energy-harvesting circuit may be used to supply power to the active circuits which synthesize certain elements.

Other embodiments and uses of the invention will be apparent to those skilled in the art from consideration of the specification and practice of the invention disclosed herein. All references cited herein, including all publications, U.S. and foreign patents and patent applications, are specifically and entirely incorporated by reference. It is intended that the specification and examples be considered exemplary only with the true scope and spirit of the invention indicated by the following claims. Furthermore, the term "comprising of" includes the terms "consisting of" and "consisting essentially of."

The invention claimed is:

1. A symmetric reflectionless filter comprising:
a symmetric two-port circuit, wherein the symmetry defines an even-mode equivalent circuit and an odd-mode equivalent circuit when the ports are driven in-phase and 180° out-of-phase, respectively;
wherein the even-mode equivalent circuit is a terminated ladder-topology of filter elements with fully-independent element values;
wherein at least one of the filter elements is synthesized from active circuits; and
the odd-mode equivalent circuit is the dual topology of the even-mode equivalent circuit, such that:
a normalized input impedance of the even-mode equivalent circuit is substantially equal to a normalized input admittance of the odd-mode equivalent circuit; and
a normalized input impedance of the odd-mode equivalent circuit is substantially equal to a normalized input admittance of the even-mode equivalent circuit.

2. The reflectionless filter of claim 1, wherein the reflectionless filter is implemented monolithically on a Silicon integrated circuit.

3. The reflectionless filter of claim 1, wherein the active circuits comprise one or more of transistors, differential pairs, operational amplifiers (op-amps), current-conveyors, Micro-Electro-Mechanical devices (MEMs), General Impedance Converters (GICs), and Negative Impedance Converters (NICs).

4. The reflectionless filter of claim 1, wherein at least one of the active circuits employs feedback.

5. The reflectionless filter of claim 4, wherein the feedback is one of positive, negative, and both positive and negative.

6. The reflectionless filter of claim 1, wherein the elements synthesized from the active circuits are one or more of inductors, capacitors, and resistors.

7. The reflectionless filter of claim 6, wherein one or more of the elements synthesized takes on negative values.

8. The reflectionless filter of claim 1, wherein at least one of the active circuits is a Negative Impedance Converter (NIC), and wherein the NIC is one of a Current-Inverting Negative Impedance Converter (INIC) and a Voltage-Inverting Negative Impedance Converter (VNIC).

9. The reflectionless filter of claim 1 wherein the elements synthesized from the active circuits are one of grounded and floating.

10. The reflectionless filter of claim 1, wherein the filter includes an energy-harvesting circuit to absorb stop-band power incident upon the filter.

11. The reflectionless filter of claim 10, wherein the energy-harvesting circuit is used to supply power to at least one of the active circuits.

* * * * *